(12) United States Patent
Kawaguchi et al.

(10) Patent No.: US 9,285,401 B2
(45) Date of Patent: Mar. 15, 2016

(54) CURRENT DETECTING DEVICE AND ATTACHING STRUCTURE THEREOF

(75) Inventors: Yasunori Kawaguchi, Shimada (JP); Shinichi Hashio, Shimada (JP); Toshirou Mochizuki, Shimada (JP)

(73) Assignee: Yazaki Corporation, Tokyo (JP)

( * ) Notice: Subject to any disclaimer, the term of this patent is extended or adjusted under 35 U.S.C. 154(b) by 135 days.

(21) Appl. No.: 13/819,031

(22) PCT Filed: Sep. 22, 2011

(86) PCT No.: PCT/JP2011/072494
§ 371 (c)(1),
(2), (4) Date: Feb. 26, 2013

(87) PCT Pub. No.: WO2012/039514
PCT Pub. Date: Mar. 29, 2012

(65) Prior Publication Data
US 2013/0154617 A1  Jun. 20, 2013

(30) Foreign Application Priority Data

Sep. 24, 2010  (JP) .................................. 2010-214081

(51) Int. Cl.
*G01R 19/15* (2006.01)
*G01R 31/36* (2006.01)
*G01R 15/20* (2006.01)

(52) U.S. Cl.
CPC ............ *G01R 19/15* (2013.01); *G01R 31/3696* (2013.01); *G01R 15/207* (2013.01)

(58) Field of Classification Search
CPC ....................................................... G01R 33/02
See application file for complete search history.

(56) References Cited

U.S. PATENT DOCUMENTS

| 7,786,386 B2 * | 8/2010 | Tarchinski ................. 174/125.1 |
| 2006/0082357 A1 | 4/2006 | Tsukamoto |

(Continued)

FOREIGN PATENT DOCUMENTS

| CN | 101806821 A | 8/2010 |
| JP | 2-270246 A | 11/1990 |

(Continued)

OTHER PUBLICATIONS

International Search Report dated Dec. 27, 2011 issued by the International Searching Authority in counterpart International Application No. PCT/JP2011/072494.

(Continued)

*Primary Examiner* — Tung X Nguyen
*Assistant Examiner* — Feba Pothen
(74) *Attorney, Agent, or Firm* — Sughrue Mion, PLLC

(57) ABSTRACT

A current detecting device includes a busbar, a magneto-electric converting element that outputs a signal in response to a magnetic field generated from the busbar, a housing that accommodates the busbar and the magneto-electric converting element, and a shield plate that is attached to the housing. The shield plate is formed in the U-shape in cross section in which an opening is formed between leading ends of a pair of side plates. The leading ends of the pair of side plates of the shield plate are located more inside than an opening peripheral edge of an opening portion of the outer frame portion so that a predetermined distance is secured between the leading ends of the pair of side plates of the shield plate and the opening peripheral edge of the opening portion of the outer frame portion.

5 Claims, 8 Drawing Sheets

(56) References Cited

U.S. PATENT DOCUMENTS

| | | |
|---|---|---|
| 2008/0186021 A1 | 8/2008 | Hashio et al. |
| 2010/0207625 A1 | 8/2010 | Ueno et al. |
| 2011/0148407 A1 | 6/2011 | Kawaguchi et al. |

FOREIGN PATENT DOCUMENTS

| | | |
|---|---|---|
| JP | 2002-050415 A | 2/2002 |
| JP | 2004-101384 A | 4/2004 |
| JP | 2008-151743 A | 7/2008 |
| JP | 2009-150653 A | 7/2009 |
| JP | 2009-193708 A | 8/2009 |
| JP | 2009-258048 A | 11/2009 |
| JP | 2010008050 A | 1/2010 |
| JP | 2010078586 A | 4/2010 |
| JP | 2010-185848 A | 8/2010 |
| WO | 2010082654 A1 | 7/2010 |

OTHER PUBLICATIONS

Written Opinion dated Dec. 27, 2011 of the International Searching Authority in counterpart International Application No. PCT/JP2011/072494.

Office Action dated Jun. 10, 2014 issued by the Japanese Patent Office in corresponding Japanese Application No. 2010-214081.

Office Action dated Jun. 26, 2014 issued by the State Intellectual Property Office of the People's Republic of China in counterpart Chinese Patent Application No. 201180046158.7.

Office Action, Issued by the State Intellectual Property Office of P.R. China, Dated Dec. 5, 2014, in counterpart Chinese Application No. 201180046158.7.

* cited by examiner

CURRENT DETECTING DEVICE AND ATTACHING STRUCTURE THEREOF

TECHNICAL FIELD

The present invention relates to a current detecting device which is adapted to grasp the degree of consumption of a vehicle battery by detecting an electric current flowing through a wire harness of a vehicle, and to an attaching structure of the current detecting device.

BACKGROUND ART

Recently, the kinds and the number of electric equipments of a vehicle are increasing rapidly, and the consumption of the vehicle battery is becoming rapidly. Therefore, a value of electric current flowing through a wire harness connected to the battery is measured by a current detecting device, and on the basis of the measured data, the degree of consumption of the battery is grasped.

As a conventional current detecting device used for such the purpose, a device described in, for example, PTL 1 has been known. FIG. 9 is an exploded perspective view of a current detecting device described in PTL 1, and FIG. 10 is a sectional view of a main portion thereof.

As shown in FIG. 9, this current detecting device 210 includes a busbar 230, a magneto-electric converting element 250, a housing 220 and a shield plate 260. An electric current flows through the busbar 230. The magneto-electric converting element 250 is arranged close to the busbar 230, and outputs an electric signal in response to a magnetic field generated by the current flowing through the busbar 230. The housing 220 is made of nonmagnetic resin, and accommodates the magneto-electric converting element 250 and a part 231 of the busbar opposing to the magneto-electric converting element 250 with a constant relation. The shield plate 260 for magnetic shield is attached to a main body portion 226 of the housing 220 so as to surround the magneto-electric converting element 250 and a part 231 of the busbar which are accommodated and held in the main body portion 226 of the housing 220.

A part 231 of the busbar 230, as shown in FIG. 10, is accommodated inside an accommodating hole 226A formed on a one-side face of the main body portion 226 of the housing 220. Further, the magneto-electric converting element 250 is mounted on a circuit board 251, and the circuit board 251 is accommodated inside an accommodating hole 226B formed on the other-side face of the main body portion 226 of the housing 220.

Further, as shown in FIGS. 9 and 10, the shield plate 260 includes a pair of side plates 261 and a connecting plate which connects base ends of the both side plates 261 to each other, and is formed in section in the U-shape in which an opening portion 265 is formed between leading ends of the both side plates 261. The shield plate 260 is fitted to the outside of the main body portion 226 of the housing 220 from the leading end side of the opening portion 265. A claw portion 263 at the leading end of the side plate 261 of the shield plate 260 engages with the housing main body portion 226, whereby the shield plate 260 is fixed to the housing 220.

CITATION LIST

Patent Literature

[PTL 1] JP-A-2010-78586

SUMMARY OF INVENTION

Technical Problem

The shield plate 260 is used to shield the magneto-electric converting element 250 and surrounding environment thereof. However, in the case of the shield plate 260 which is U-shaped in section, it has been known that there is concern that an output error (gain error) will be produced if a magnetic substance 300 such as a vehicle bonnet or body comes close to the opening portion 265 formed on one face of the shield 260 as shown in FIG. 11.

Upon measuring a relation between the distance a between the leading end of the side plate 261 of the shield plate 260 and the magnetic substance 300, and the gain error, such a characteristic as shown in FIG. 12 has been obtained. From this result, it is known that the gain error increases rapidly when the distance a becomes smaller than a value (for example, below 5 mm). Accordingly, in spite of use of the shield plate 260, there is possibility that accuracy of detection is affected depending on the attaching environment of the shield plate 260.

Regarding this point, in the related current detecting device 210, since the whole of the shield plate 260 is exposed to the outside, and additionally, the leading ends of the both side plates 261 of the shield plate 260 project more to the outside than the housing 220, it is impossible to prevent excessive approach of the magnetic substance to the opening portion 265 of the shield plate 260, with the result that there has been possibility that the output error may occur.

Solution to Problem

The invention has been made in view of the above circumstances, and it is an object of the invention to provide a current detecting device which can prevent excessive approach of a magnetic substance to an opening portion of a shield plate thereby to decrease the occurrence of an output error and obtain stable output, and attaching structure thereof.

In order to achieve the above object, a current detecting device according to the invention has the following features (1) to (3).

(1) There is provided a current detecting device comprising:

a busbar through which an electric current flows;

a magneto-electric converting element that outputs a signal in response to a magnetic field generated by the electric current flowing through the busbar;

a housing that is made of nonmagnetic material, and accommodates the busbar and the magneto-electric converting element therein; and a shield plate for magnetic shield that is attached to the housing so as to surround the magneto-electric converting element and a part of the busbar which is opposed to the magneto-electric converting element, wherein the shield plate includes a pair of side plates and a connecting plate which connects base ends of the pair of side plates to each other, and is formed in the U-shape in cross section in which an opening is formed between leading ends of the pair of side plates;

wherein the housing includes an inner frame portion which accommodates the busbar and the magneto-electric converting element and an outer frame portion which covers the outside of the shield plate, and the shield plate is arranged at the outside of the inner frame portion;

wherein the outer frame portion is formed in a tubular shape having a first opening portion and a second opening portion which are arranged at both end sides in an extending direction of the pair of side plates; and wherein the leading ends of the pair of side plates of the shield plate are located more inside than an opening peripheral edge of the first opening portion of the outer frame portion so that a predetermined distance is secured between the leading ends of the pair of side plates of the shield plate and the opening peripheral edge of the first opening portion of the outer frame portion.

(2) Preferably, a distance between the second opening portion and the connecting plate of the shield plate is smaller than a distance between the first opening portion and the connecting plate of the shield plate.

(3) Preferably, the current detecting device further includes a cover member that is made of nonmagnetic material, and covers the connecting plate of the shield plate which is exposed outside through the second opening portion of the outer frame portion.

According to the above configurations, the opening peripheral edge of the first opening portion of the outer frame portion of the housing which covers the outside of the shield plate protrudes more to the outside than the leading ends of the pair of side plates of the shield plate, and the predetermined distance is secured between the leading ends of the pair of side plates of the shield plate and the opening peripheral edge of the first opening portion of the outer frame portion. Therefore, it is possible to prevent excessive approach of a magnetic substance to the opening portion of the shield. Accordingly, the occurrence of output error can be reduced, and stable output can be obtained. Further, the shield plate can be protected by the outer frame portion of the housing.

Also, according to the above configuration, since the cover made of nonmagnetic material is provided so as to cover the connecting plate of the shield plate exposed to outside through the second opening portion of the outer frame portion of the housing, it is possible to prevent a magnetic substance such as iron powder from adhering to the connecting plate of the shield plate. Further, it is possible to prevent a touch on the shield plate with someone's hand, and it is possible to prevent something from abutting directly on the shield plate and applying impact onto the shield plate. In result, the occurrence of the output error can be reduced.

In order to achieve the above object, an attaching structure of current detecting device according to the invention has the following feature (4).

(4) There is also provided an attaching structure comprising:

an attaching portion that is provided at one end portion of the busbar of the current detecting device; and a connecting portion that is adapted to connect a wire harness;

wherein the connecting portion is provided at the other end portion of the busbar; and wherein the current detecting device is arranged on a top face of a battery in a state that the first opening portion of the outer frame portion faces to the top face of the battery, and the attaching portion is connected to the battery post protruding from the top face of the battery so that the current detecting device is attached to the battery.

According to the above configuration, since the current detecting device is attached to the battery with the first opening portion of the outer frame portion of the housing faced toward the top face of the battery, the opening portion of the shield plate is arranged downward. Accordingly, though a magnetic substance such as a bonnet which may affect a magnetic shielding function of the shield plate, a wire harness through which large electric current flows, and the like exist above the battery, since the opening portion of the shield plate faces downward, it is possible to prevent a magnetic influence by the magnetic substance such as the bonnet and the large-current wire harness from being exerted on the shield plate. Further, including resin of a battery case upper portion, on the opening portion side of the shield plate, a space composed of nonmagnetic material can be secured sufficiently. Therefore, it is possible to prevent the influence by approach of the magnetic substance to the opening portion from being exerted on the shield plate, with the result that the stable output which is small in occurrence of the output error can be obtained.

Advantageous Effects of Invention

According to the invention, stable output with small occurrence of an output error can be obtained.

The invention has been described above in brief. Further, from through-reading of the following embodiments with reference to the accompanying drawing, the details of the invention will become more apparent.

DESCRIPTION OF EMBODIMENTS

Embodiments of the invention will be described below with reference to drawings.

<First Embodiment>

Figure 1:
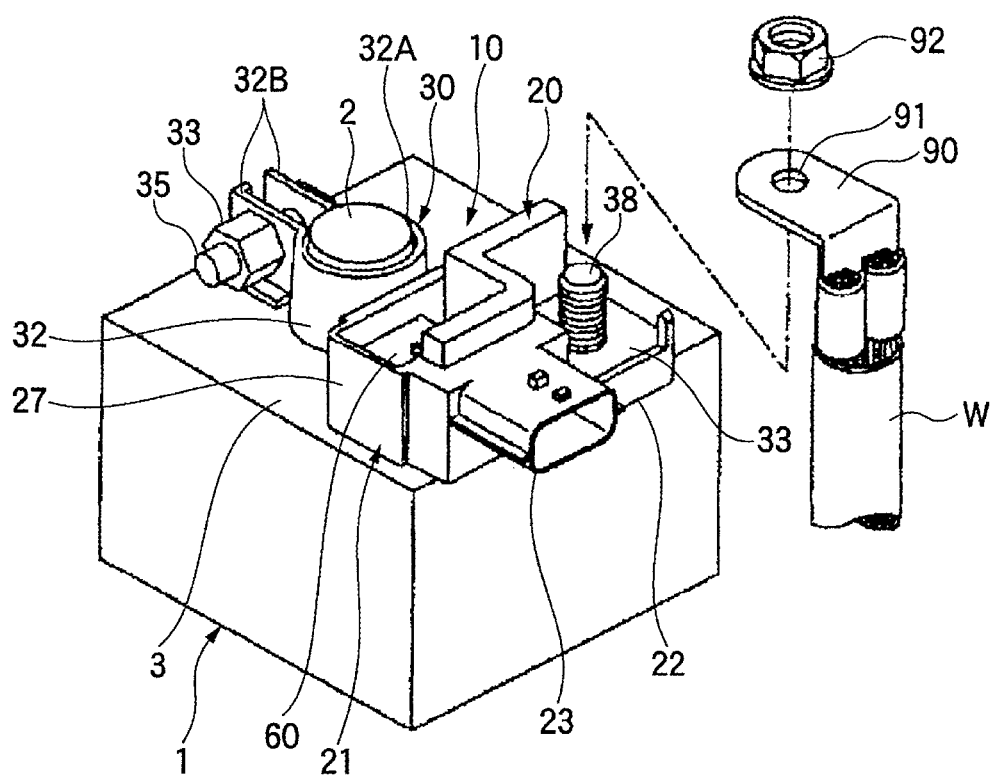
FIG. 1 is a perspective view showing a state where a current detecting device according to a first embodiment of the invention is attached to a battery.
Figure 2:
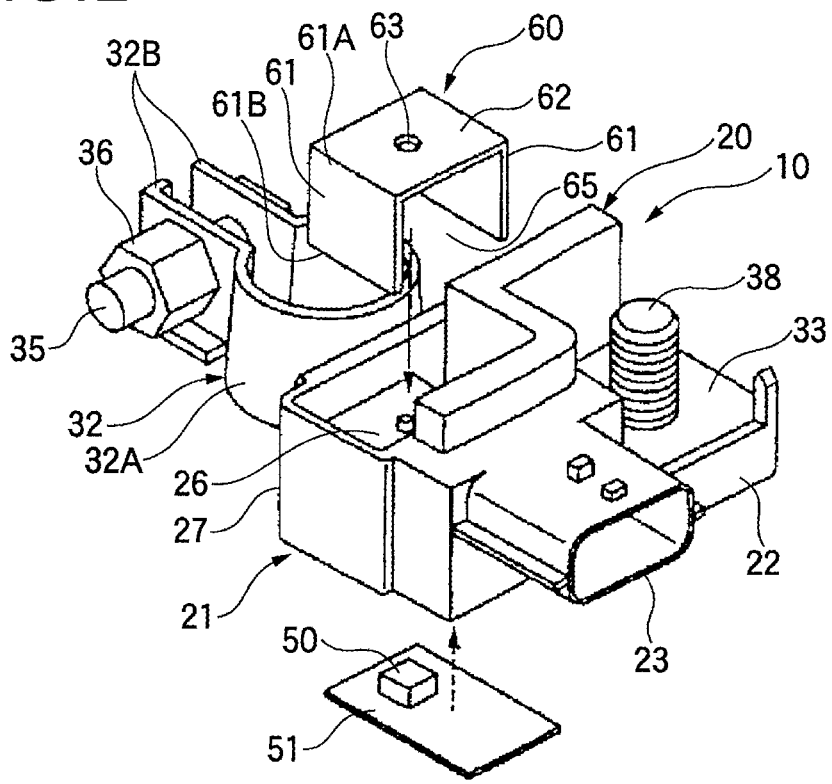
FIG. 2 is an exploded perspective view of the same current detecting device.
Figure 3:
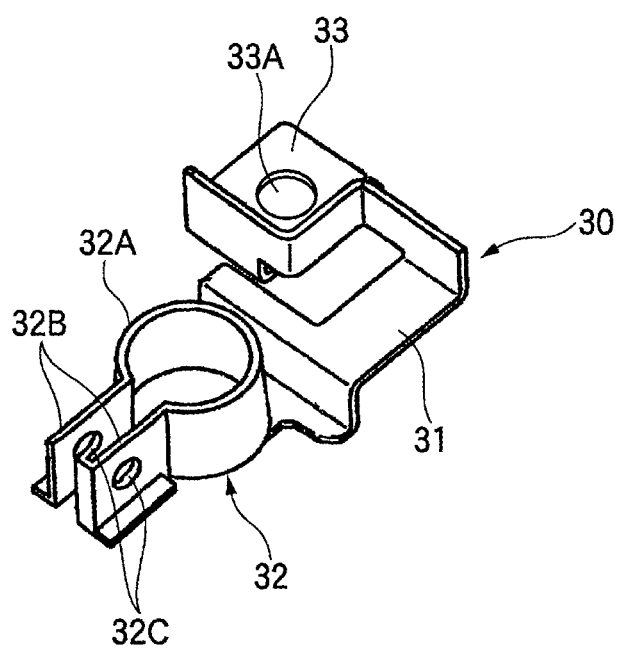
FIG. 3 is a perspective view showing a configuration of a busbar used in the current detecting device.
Figure 4:
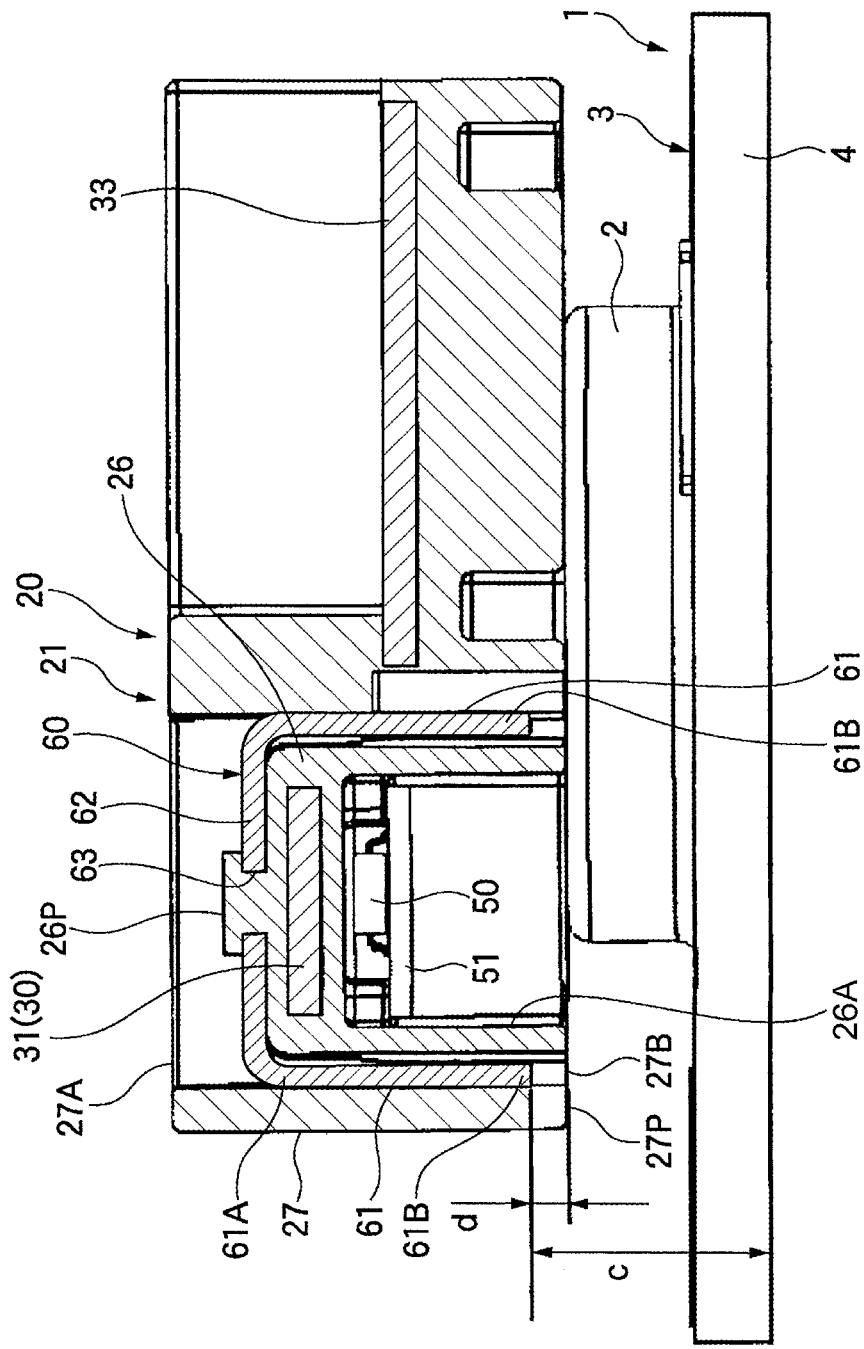
FIG. 4 is a main portion sectional view of the current detecting device.

FIG. 1 is a perspective view showing a state where a current detecting device according to the first embodiment of the invention is attached to a battery, FIG. 2 is an exploded perspective view of the current detecting device, FIG. 3 is a perspective view showing the constitution of a busbar used in the current detecting device, and FIG. 4 is a main portion sectional view of the current detecting device.

As shown in FIGS. 1 to 4, a current detecting device 10 is constituted as a battery terminal unit to be attached to a battery post 2 protruding from a top face of a battery 1. The current detecting device 10 includes a busbar 30, a magneto-electric converting element 50, a housing 20 and a shield plate 60. An electric current flows through the busbar 30. The magneto-electric converting element (for example, Hall element) 50 is mounted on a circuit board 51 and is arranged close to this busbar 30, and outputs an electric signal in response to a magnetic field generated by the electric current flowing through the busbar 30. The housing 20 is made of synthetic resin (nonmagnetic material), and accommodates the busbar 30 and the circuit board 51 on which the magneto-electric converting element 50 is mounted with a constant relation. The shield plate 60 for magnetic shield, is attached to a main body portion 21 of the housing 20 so as to surround the magneto-electric converting element 50 and a current detected portion (a part) 31 of the busbar 30 which is opposed to the magneto-electric converting element 50.

As shown in FIG. 3, the bus bar 30 is formed by a bending work of a sheet-metal, and includes, the current detected portion 31 is arranged between an attaching portion 32 to the battery post 2 and a connecting portion 33 to a wire harness W. The attaching portion 32 to the battery post 2 includes a U-shaped annular tightening portion 32A which fits to the outside of the battery post 2, and a pair of tightening bases 32B each having a bolt through-hole 32C which are provided at both ends in the circumferential direction of the U-shaped annular tightening portion 32A. As shown in FIG. 1, the U-shaped annular tightening portion 32A is fitted to the outside of the battery post 2, a shaft portion of a bolt 35 is inserted into the bolt through-holes 32C, and a nut 36 is tightened to the shaft portion, whereby the attaching portion 32 is fixed to the battery post 2. Further, a stud bolt 38 for fastening a terminal 90 by a nut 92 is fixed to the connecting portion 33 for the wire harness W through a through-hole 91 of the terminal 90 which is attached to an end portion of the wire harness W.

The housing 20 is formed by insert molding together with the busbar 30 by arranging the busbar 30 in a mold so that a portion except for necessary portions of the busbar 30 is embedded inside the resin constituting the housing 20. Namely, the whole of the attaching portion 32 to the battery post 2 is in an exposed state to the outside, the current detected portion 31, as shown in FIG. 4, is embedded inside the wall of the main body portion 21 of the housing 20, and the top face of the connecting portion 33 to the wire harness W and the stud bolt 38 are in the exposed state.

The housing 20 is provided with the main body portion 21 which accommodates the magneto-electric converting element 50 and the like therein, a connector housing portion 23 adjacent to the main body portion 21, and a wire harness attaching portion 22 which supports the connecting portion 33 to wire harness of the busbar 30 and the stud bold 38. Inside the connector housing portion 23, terminal metal-fittings (not shown) are arranged, and one end of these terminal metal-fittings is connected to the circuit board 51.

The shield plate 60 prevents the output of the magneto-electric converting element 50 from varying greatly due to a magnetic influence of the surrounding environment. The shield plate 60 includes a pair of side plates 61 and a connecting plate 62 which connects base ends 61A of the side plates 61, and has the U-shaped section in which an opening portion 65 is formed between leading ends 61B of the both side plates 61.

Further, the main body portion 21 of the housing 20, as shown in FIG. 4, includes an inner frame portion 26 which accommodates therein the current detected portion 31 of the busbar 30 and the circuit board 51 on which the magneto-electric converting element 50 is mounted and an outer frame portion 27 covering the outside of the shield plate 60. The shield plate 60 is arranged outside of the inner frame portion 26.

In the inner frame portion 26, an accommodation hole 26A is provided, and the circuit board 51 mounting the magneto-electric converting element 50 is accommodated inside the accommodation hole 26A. Further, in a thick bottom wall of the accommodation hole 26A, the current detected portion 31 of the busbar 30 is embedded. Hereby, the current detected portion 31 of the busbar 30 and the magneto-electric converting element 50 are opposed to each other with a constant relation.

Further, the outer frame portion 27 of the housing 20 is formed in the shape of a tube having an one-end side opening portion 27B for attaching the circuit board 51 mounting the magneto-electric converting element 50 inside the inner frame portion 26, and the other-end side opening portion 27A for inserting the shield plate 60 from the leading end 61B side of the both side plates 61 to the outside of the inner frame portion 26 so as to be attached thereto.

To the outside of the inner frame portion 26, the shield plate 60 is inserted from the other-end side opening portion 27 side of the outer frame portion 27 and attached thereto, a through-hole 63 in the connecting plate 62 of the shield plate 60 is fitted to a pin 26P projecting from the outer face of the bottom wall of the accommodation hole 26A of the inner frame portion 26, and thereafter the pin 26P is fused, whereby the shield plate 60 is fixed to the inner frame portion 26.

Figure 12:
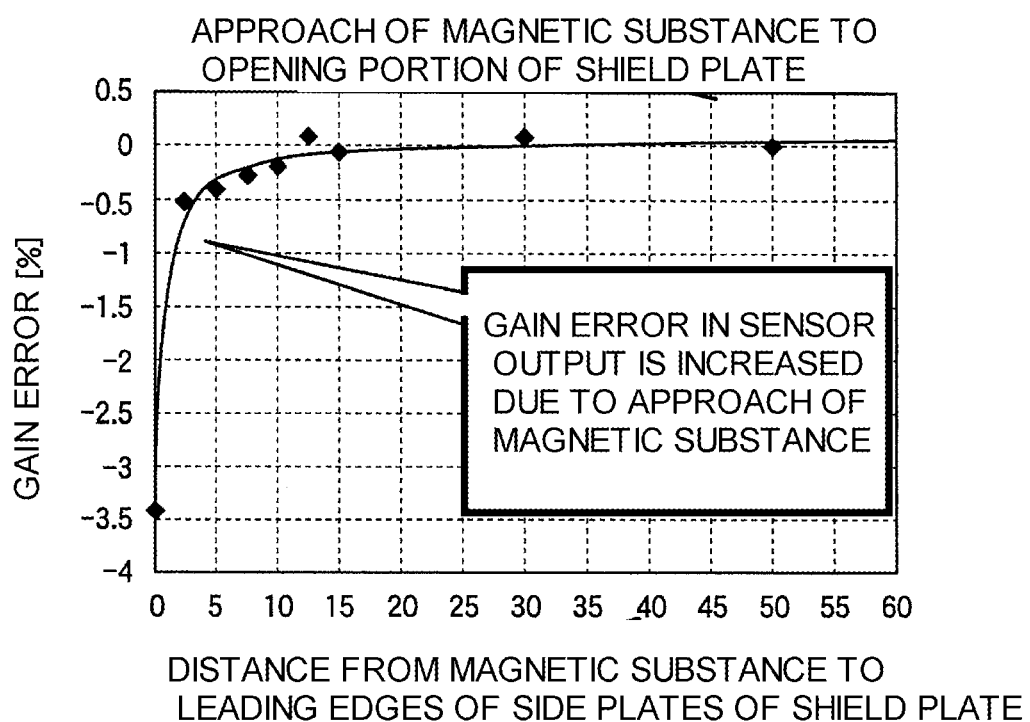
FIG. 12 is a characteristic diagram showing a relation between an approach distance in case that the magnetic substance has come close to the opening portion of the shield plate having the U-shaped section and a gain error.

In a state where the shield plate 60 is fixed to the inner frame portion 26, the leading ends 61B of the both side plates 61 of the shield plate 60 are located more inside than an opening peripheral edge 27P of the one-end side opening portion 27B of the outer frame portion 27 covering the outside of the shield plate 60. That means, the leading ends 61B of the both side plates 61 of the shield plate 60 are recessed from the opening peripheral edge 27P of the one-end side opening portion 27B of the outer frame portion 27 by a predetermined distance. Hereby, a predetermined distance d is secured between the leading ends 61B of the both side plates 61 of the shield plate 60 and the opening peripheral edge 27P of the one-end side opening portion 27B of the outer frame portion 27. This distance d is determined on the basis of a characteristic diagram of FIG. 12 in response to accuracy required for the current detecting device 10. For example, the distance d is set to 5 mm or more in which a gain error does not increase rapidly.

Further, the thus constructed current detecting device 10, as shown in FIGS. 1 and 4, is arranged on the top face 3 of the battery 1 with the one-end side opening portion 27B of the outer frame portion 27 of the housing 20 faced downward so that the portion 27B faces toward the top face 3 of the battery 1, and the attaching portion 32 is connected to the battery post 2 in that state, whereby the current detecting device 10 is attached to the battery 1.

According to the current detecting device 10 having the above constitution, since the predetermined distance d is secured between the leading ends 61B of the both side plates 61 of the shield plate 60 and the opening peripheral edge 27P of the one-end side opening portion 27B of the outer frame portion 27, it is possible to prevent excessive approach of a magnetic substance such as a bonnet to the opening portion 65 between the leading ends 61B of the both side plates 61 of the shield plate 60. Accordingly, the occurrence of output error is reduced, and stable output can be therefore obtained. Further, since the shield plate 60 can be protected by the outer frame portion 27 of the housing 20, it is possible to prevent a touch on the shield plate 60 with a hand at the attaching time, and it is also possible to prevent something from abutting on the shield plate 60 inadvertently.

By attaching the current detecting device 10 to the battery 1 as described above, the opening portion 65 of the shield plate 60 is arranged downward. Hereby, though the magnetic substance such as a bonnet which may affect a magnetic shielding function of the shield plate 60, the wire harness in which large electric current flows, and the like exist above the battery 1, it is possible to prevent a magnetic influence by them from being exerted on the shield plate 60.

Further, as shown in FIG. 4, in addition to a resin portion 4 of the case upper portion of the battery 1, on the opening portion 65 side (refer to FIG. 2) of the shield plate 60, a space c composed of nonmagnetic material can be secured sufficiently. Therefore, it is possible to prevent the influence by approach of the magnetic substance to the opening portion 65 from being exerted on the shield plate 60, with the result that stable output which is small in occurrence of the output error can be obtained.

Figure 5:
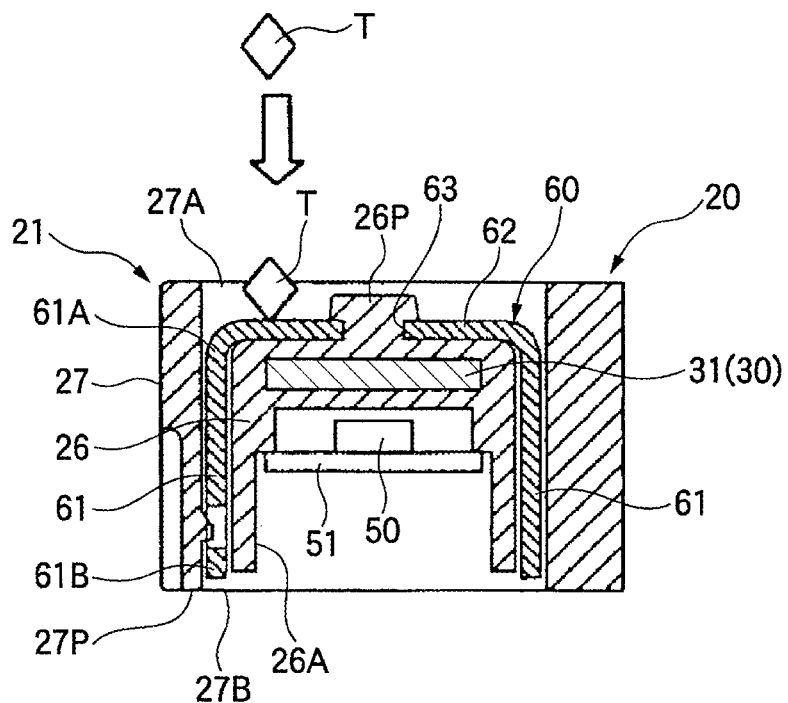
FIG. 5 is a main portion sectional view of the current detecting device, which is used for explanation of a problem to be further improved.

In case that the current detecting device 10 has been attached to the battery 1 in such the posture, the connecting plate 62 of the shield plate 60 is exposed to the upside from the other-end side opening portion 27A of the outer frame portion 27 of the housing 20. As shown in FIG. 5, in case that a magnetic substance such as iron powder T has fallen on the connecting plate 62 exposed to the upside and adhered thereto, there is possibility that a subtle influence is exerted on magnetic property (possibility that the output error occurs). Further, also in case that a touch on the shield plate 60 with someone's hand has caused rust, or something has abutted on the shield plate 60 thereby to apply impact to the shield plate 60, there is possibility that change is produced in the magnetic property. Therefore, the following current detecting devices in second to fourth embodiment take measures against their possibilities.

Figure 6:
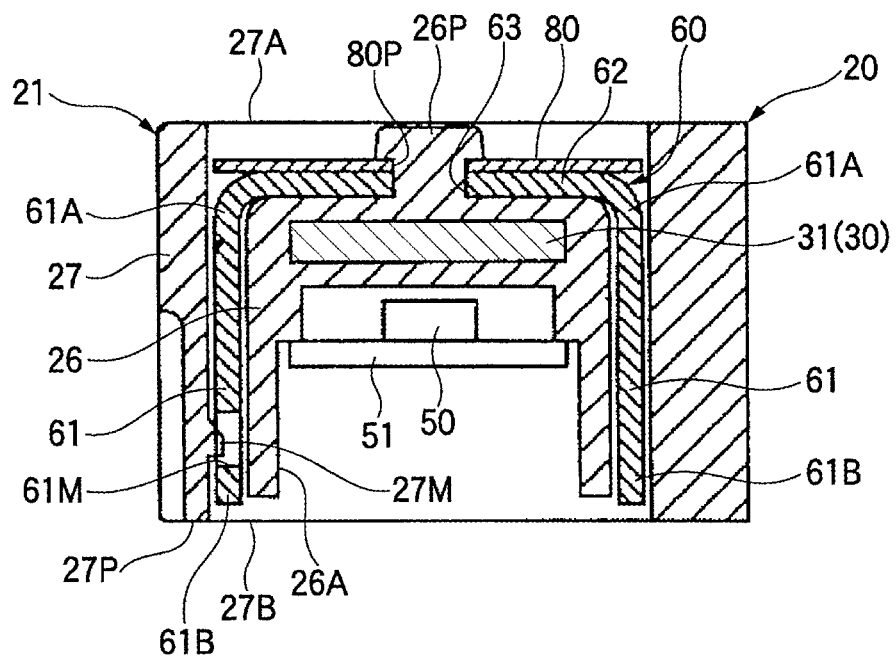
FIG. 6 is a main portion sectional view of a current detecting device according to a second embodiment of the invention.
Figure 7:
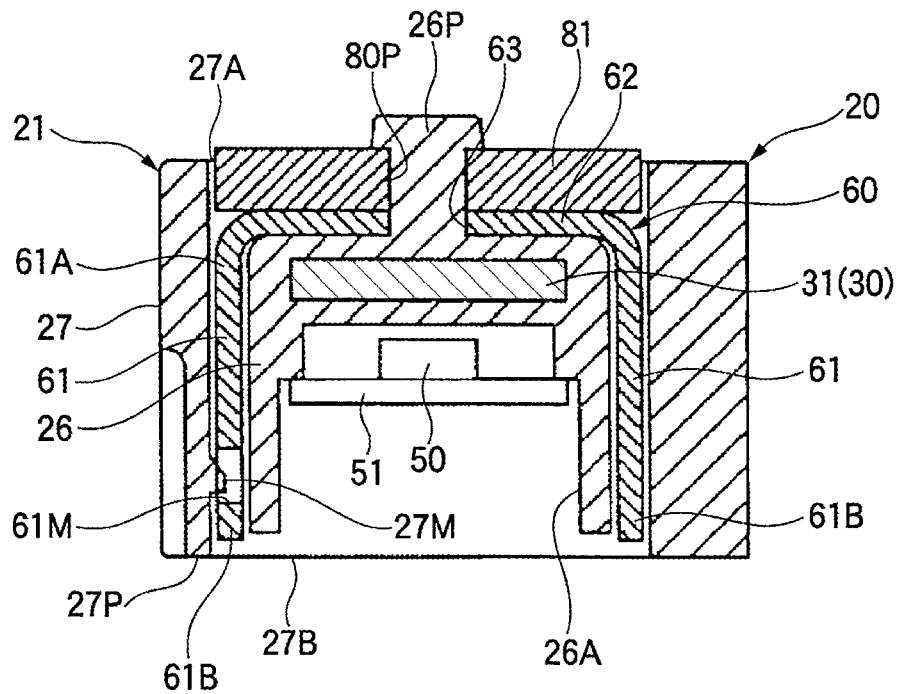
FIG. 7 is a main portion sectional view of a current detecting device according to a third embodiment of the invention.
Figure 8:
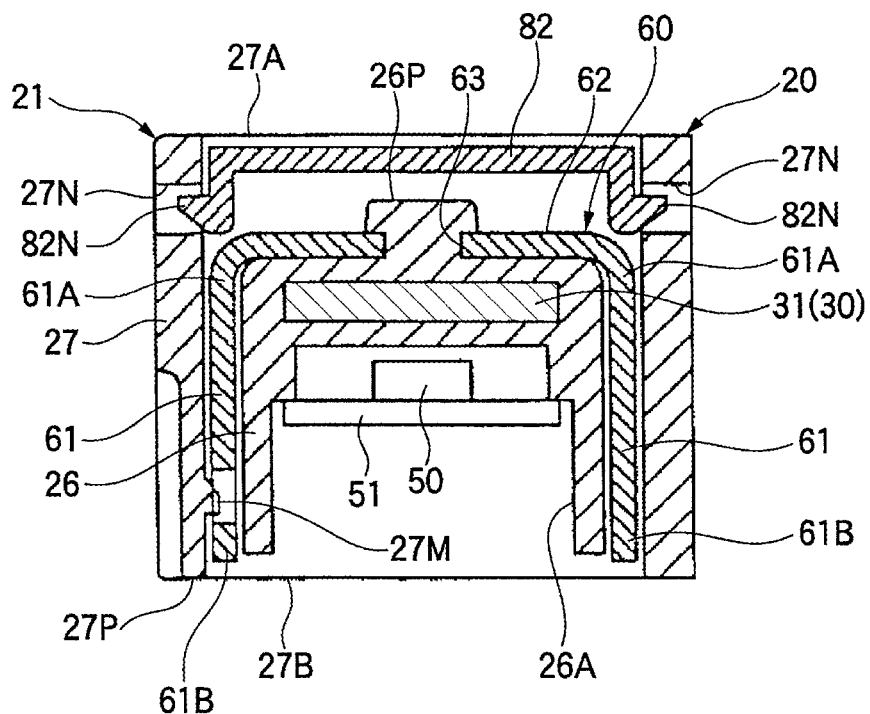
FIG. 8 is a main portion sectional view of a current detecting device according to a fourth embodiment of the invention.

FIGS. 6 to 8 are main portion sectional views of current detecting devices in second to fourth embodiments. In these embodiments, covers 80, 81, 82 made of nonmagnetic material are provided so as to cover a connecting plate 62 of a shield plate 60 exposed in the other-end side opening portion 27A of an outer frame portion 27.

<Second Embodiment>

In the second embodiment shown in FIG. 6, a thin plate-shaped cover 80 made of resin is arranged on the connecting plate 62, and a pin 26P is inserted into a through-hole 80P of the cover 80 and thereafter fused, whereby the cover 80 is fixed.

<Third Embodiment>

Further, in the third embodiment shown in FIG. 7, a thick plate-shaped cover 81 made of resin is arranged on the connecting plate 62, and a pin 26P is inserted into a through-hole 80P of the cover 81 and thereafter fused, whereby the cover 81 is fixed. The thickness of the cover 81 in this case is set so that there is not much influence even in case that a magnetic substance comes close to the cover 81 or adheres to the cover 81.

<Fourth Embodiment>

In the fourth embodiment shown in FIG. 8, plural engaging projections 82N are formed at a peripheral edge of a cover 82 made of resin, and these engaging projections 82N are engaged with engaging holes 27N in an outer frame portion 27 of a housing 20, whereby the cover 82 covers the connecting plate 62 in a non-contact state with the connecting plate 62.

Further, in these embodiments, an engaging hole 61M is provided in a side plate 61 of the shield plate 60, and also by engaging the engaging hole 61M with an engaging projection 27M of the outer frame portion 27, the shield plate 60 is fixed to the housing 20.

According to the current detecting devices in these second to fourth embodiments, since the covers 80, 81, 82 made of nonmagnetic material are provided so as to cover the connecting plate 62 of the shield plate 60 exposed in the other-end side opening portion 27A of the outer frame portion 27 of the housing 20, it is possible to prevent a magnetic substance such as iron powder from adhering to the connecting plate 62 of the shield plate 60. Further, it is possible to prevent a touch on the shield plate 60 with someone's hand, and it is possible to prevent something from abutting directly on the shield plate 60 and applying impact to the shield plate 60. In result, the occurrence of the output error can be reduced.

The invention is not limited to the above-mentioned embodiments, but modifications, improvements, and the like can be appropriately made therein. In addition, the material, the shape, the size, the number, the arranging place of each component in the above-mentioned embodiments, as long as the invention can be achieved, are arbitrary and are not restrictive.

Figure 9:
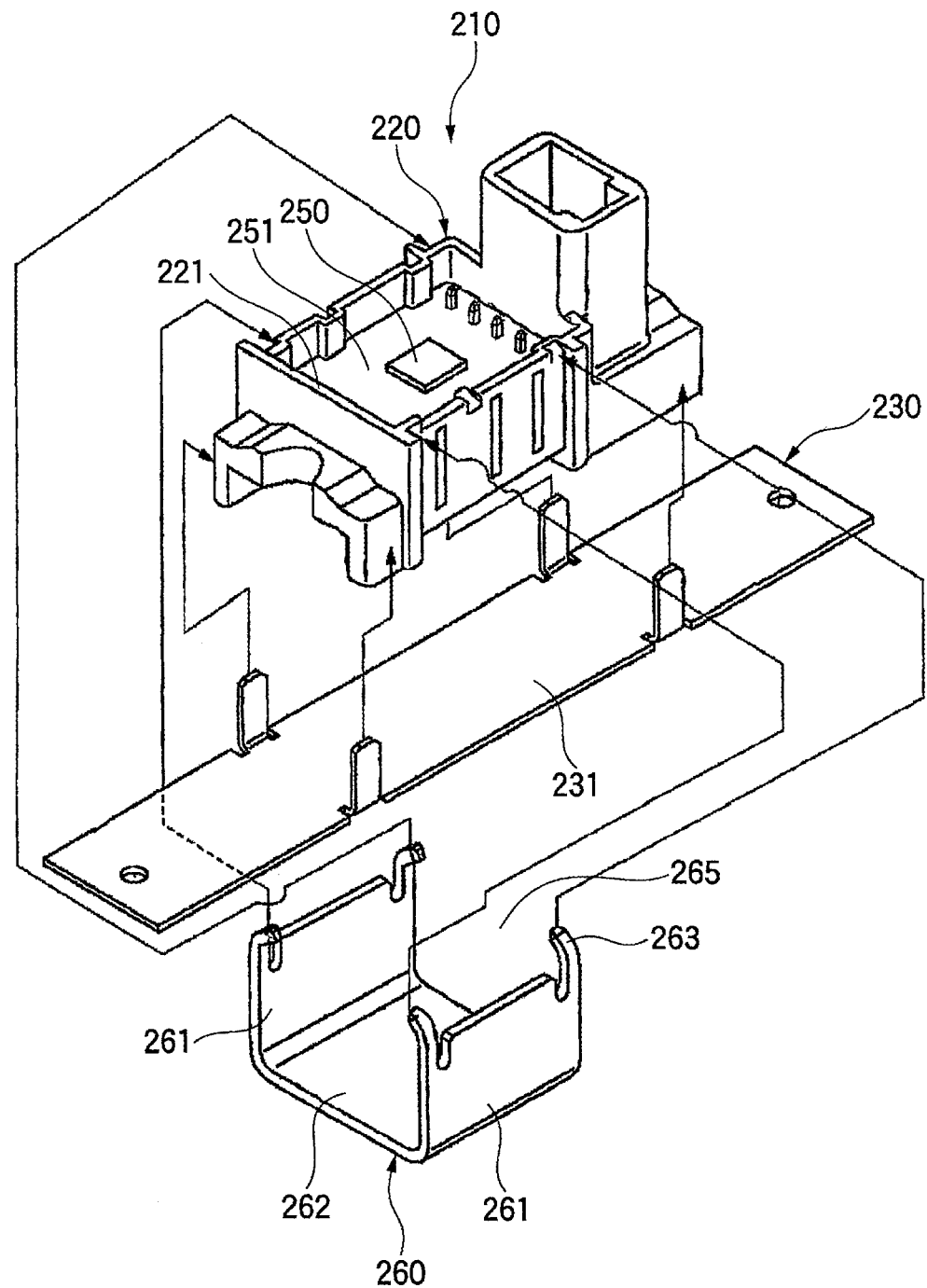
FIG. 9 is an exploded perspective view of a related current detecting device.
Figure 10:
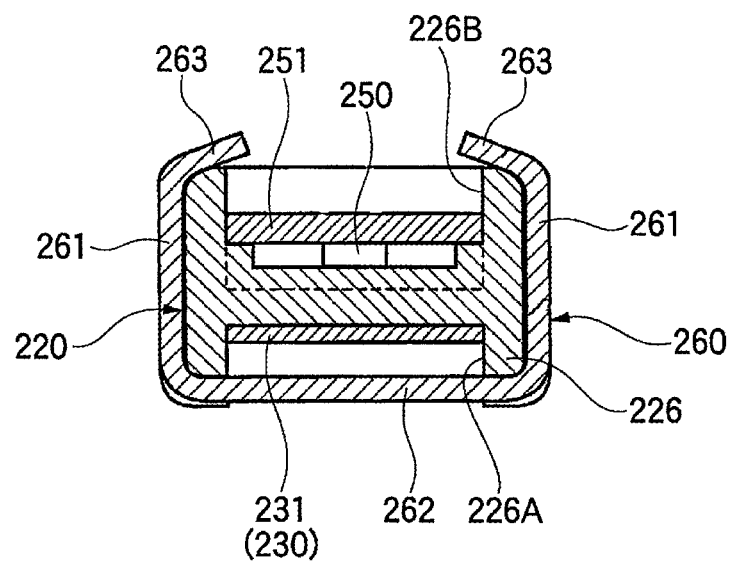
FIG. 10 is a main portion sectional view of the related current detecting device.
Figure 11:
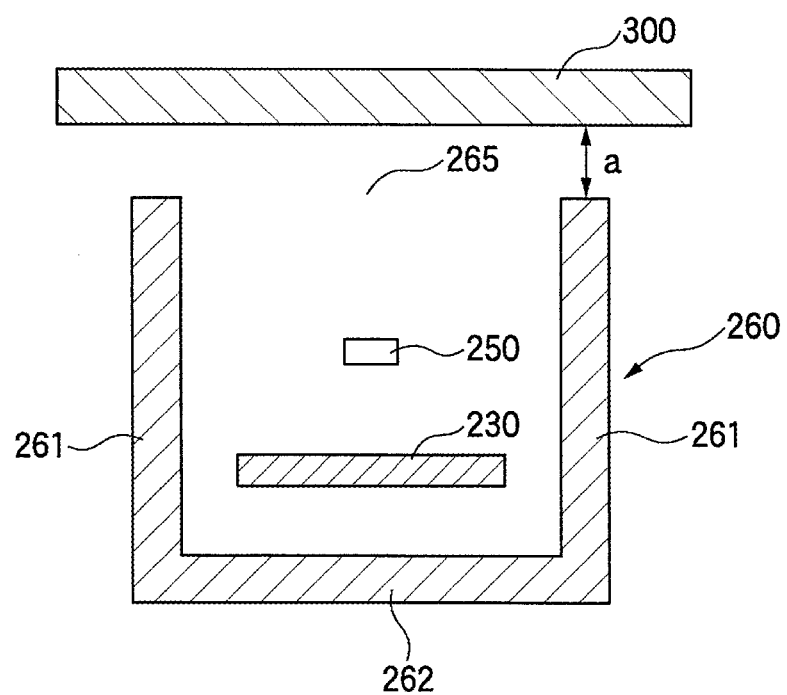
FIG. 11 is a schematically sectional view showing a situation when a magnetic substance has come close to an opening portion of a shield plate having a U-shaped section.

In the above embodiments, the case where the current detecting device of the invention is applied to the battery terminal unit has been described, but the invention is not limited to the current detecting device attached to the battery. For example, the current detecting device of the invention can be constituted also as a current detecting device of a type which uses such a simple plate-shaped busbar as shown in FIG. 9 and is set in the middle of a wire harness.

The present application is based on Japanese Patent Application No. 2010-214081 filed on Sep. 24, 2010, the contents of which are incorporated herein by reference.

Industrial Applicability

A current detecting device which prevents excessive approach of a magnetic substance to an opening portion of a shield plate can be provided. By a configuration of the current detection device, the occurrence of an output error is decreased and stable output can be obtained.

Reference Signs List

1 Battery
2 Battery post
3 Top face
10 Current detecting device
20 Housing
26 Inner frame portion
27 Outer frame portion
27A The other-end side opening portion
27B One-end side opening portion
27P Opening peripheral edge
30 Busbar
31 Current detected portion (a part of busbar)
32 Attaching portion to battery post
33 Connecting portion to wire harness
50 Magneto-electric converting element
51 Circuit board
60 Shield plate
61 Side plate
62 Connecting plate
65 Opening portion
80 to 82 Cover
d Predetermined distance

The invention claimed is:

1. A current detecting device comprising:

a busbar through which an electric current flows;

a magneto-electric converting element that outputs a signal in response to a magnetic field generated by the electric current flowing through the busbar;

a housing that is made of nonmagnetic material, and accommodates the busbar and the magneto-electric converting element therein; and a shield plate for magnetic shield that is attached to the housing so as to surround the magneto-electric converting element and a part of the busbar which is opposed to the magneto-electric converting element, wherein the shield plate includes a pair of side plates and a connecting plate which connects base ends of the pair of side plates to each other, and is formed in the U-shape in cross section in which an opening is formed between leading ends of the pair of side plates;

wherein the housing includes an inner frame portion which accommodates the busbar and the magneto-electric converting element and an outer frame portion which covers the outside of the shield plate, and the shield plate is arranged at the outside of the inner frame portion such that the shield plate is disposed between the inner and outer frame portions;

wherein the outer frame portion is formed in a tubular shape having a first opening portion and a second opening portion which are arranged at both end sides of the outer frame portion in an extending direction of the pair of side plates; and wherein the leading ends of the pair of side plates of the shield plate are located more inside than an opening peripheral edge of the first opening portion of the outer frame portion so that a predetermined distance is secured between the leading ends of the pair of side plates of the shield plate and the opening peripheral edge of the first opening portion of the outer frame portion.

2. The current detecting device according to claim 1, wherein a distance between the second opening portion and the connecting plate of the shield plate is smaller than a distance between the first opening portion and the connecting plate of the shield plate.

3. The current detecting device according to claim 1, further comprising:

a cover member that is made of nonmagnetic material, and covers the connecting plate of the shield plate which is exposed outside through the second opening portion of the outer frame portion.

4. An attaching structure comprising:

an attaching portion that is provided at one end portion of the busbar of the current detecting device according to claim 1; and a connecting portion that is adapted to connect a wire harness;

wherein the connecting portion is provided at the other end portion of the busbar; and wherein the current detecting device is arranged on a top face of a battery in a state that the first opening portion of the outer frame portion faces to the top face of the battery, and the attaching portion is connected to the battery post protruding from the top face of the battery so that the current detecting device is attached to the battery.

5. The current detecting device according to claim 1, wherein the outer frame surrounds the pair of side plates.

* * * * *